United States Patent [19]

Clark, Jr. et al.

[11] Patent Number: 4,629,931
[45] Date of Patent: Dec. 16, 1986

[54] LIQUID METAL ION SOURCE

[75] Inventors: William M. Clark, Jr., Thousand Oaks, Calif.; Charles M. McKenna, Boxford, Mass.; William L. Johnson, Pasadena, Calif.

[73] Assignee: Hughes Aircraft Company, Los Angeles, Calif.

[21] Appl. No.: 673,466

[22] Filed: Nov. 20, 1984

[51] Int. Cl.$^4$ .............................................. H01J 1/05
[52] U.S. Cl. ................................. 313/362.1; 204/298; 313/363.1; 250/423 R
[58] Field of Search ..................... 204/298; 313/362.1, 313/363.1, 163, 232, 550, 566; 315/111.81; 250/423 R

[56] References Cited

U.S. PATENT DOCUMENTS

| | | | |
|---|---|---|---|
| 4,088,919 | 5/1978 | Clampitt et al. | 313/362.1 |
| 4,367,429 | 1/1983 | Wang et al. | 313/362.1 |
| 4,426,582 | 1/1984 | Orloff et al. | 250/396 ML |
| 4,488,045 | 12/1984 | Anazawa et al. | 250/423 R |

FOREIGN PATENT DOCUMENTS

| | | | |
|---|---|---|---|
| 58-32346 | 2/1983 | Japan | 315/111.81 |
| 58-198822 | 11/1983 | Japan | 315/111.81 |

Primary Examiner—John F. Niebling
Assistant Examiner—William T. Leader
Attorney, Agent, or Firm—Wanda K. Denson-Low; A. W. Karambelas

[57] ABSTRACT

A liquid metal ion source alloy for high vapor pressure metalloids, wherein the alloy composition is chosen to have a low melting point so that the vapor pressure of the volatile constituents is low, even in the liquid state. Specifically, the ion source alloy is an alloy selected from the group of $(Pb_{0.7-1.0} Au_{0.3-0})_{0.7-0.99} (As+Sb)_{0.3-0.01}$ and $Pb_{0.20-0.30} Au_{0.45-0.55} (As+Sb)_{0.20-0.30}$. The melting points of these alloys are about 200° C.–300° C., and the alloys may be maintained molten in contact with the emission elements for long periods of time without significant loss of the volatile species or reactivity with typical substrate materials used for emission elements.

4 Claims, 3 Drawing Figures

LIQUID METAL ION SOURCE

The U.S. Government has rights in this invention pursuant to Contract No. 81-F597-000, awarded by the Department of the Air Force.

BACKGROUND OF THE INVENTION

This invention relates to liquid metal ion sources, and, more particularly, to alloys used as liquid metal ion sources for high vapor pressure metalloids.

Liquid metal ion sources provide high current density beams of metallic ions from a source having a small virtual source size. Such high brightness and small source size are required when the ion beam is to be focused with a high resolution of, for example, less than one micron spot size and utilized in applications such as fabrication of semiconductor microcircuits by ion implantation. The high current density and small virtual source size are achieved by emitting the ions from a substrate having a sharp point, such as the point of a needle. In one such approach, a needle is covered with a layer of liquid ion source metal, and a cusp in the liquid metal at the point of the needle is created by application of an electrostatic field. This tiny cusp then becomes the emitting source for the ions. As the ions are emitted from the source, more liquid metal flows from a reservoir down the needle to the cusp to replenish that evaporated.

In this type of ion source, a species to be implanted typically resides in a liquid alloy while in the reservoir and on the needle. This alloy must be heated to at least its melting point and remain in the molten state for long periods of time, typically at least 12 to 24 hours. When an alloy is held molten for this long period of time, species which have high vapor pressures can be lost from the alloy in significant amounts. This not only raises the pressure in the region of the needle to unacceptably high levels (ion focusing systems require pressure less than approximately $10^{-5}$ Torr) but also substantially impacts the alloy composition over time. This change in the composition of the ion source alloy over time can be highly significant in the fabrication of semiconductor microcircuits, due to the resultant change in composition and current density of species as it is implanted into the semiconductor. Additionally, the long period of contact between the molten alloy and the emission elements of the liquid metal ion source, including the reservoir and the needle substrate, can cause corrosion and failure of these elements.

The most straightforward approach to providing an evaporation source for a species is to provide it in its elemental, unalloyed form. However, many important and desirable dopant ion metalloids and metals for implantation of active areas of silicon microcircuits, such as arsenic, antimony, and phosphorus, have relatively high vapor pressures at their melting points. The melting points are also rather high, so that corrosion of the evaporation elements is possible when the liquid and evaporation element are in contact for long periods of time.

One alternative approach is to form an alloy of the desired evaporation species with other metal or metalloid constituents chosen to chemically bond with the desired evaporation metal or metalloid in the liquid state. This bonding tends to reduce the vapor pressure of the desired evaporation species by retaining it in the alloy. However, even with this technique for artificially suppressing the vapor pressure of the volatile constituents, the melting points of such alloys may still be sufficiently high to damage the ion source evaporation elements by corrosion.

Consequently, there exists a continuing need for better source alloys for use in liquid metal ion sources. Such alloys desirably would have low melting points, low vapor pressures of the volatile constituents when the alloy is molten, and would not corrode the components of the liquid metal ion source during long periods of operation. It would be further desirable if such source alloys could be used, in conjunction with a mass separator, as the source for different desirable dopant species. The present invention fulfills this need, and further provides related advantages.

SUMMARY OF THE INVENTION

The present invention provides a low melting point liquid metal source alloy, for the metalloids arsenic and antimony. The vapor pressure of the metalloids is low at the melting point, so that the source alloys may be held molten for long periods of time without substantial changes in composition. These alloys do not exhibit substantial reactivity or corrosivity with standard construction materials used in evaporation elements, such as cold rolled steel, nickel, molybdenum, tungsten, and rhenium. Further, in some instances the source alloys may be used in ion beam systems as a source of either arsenic or antimony, with the desired species being selected by a mass separator in the ion beam system.

In accordance with the invention, a liquid metal ion source comprises an emitter means for emitting positively charged ions of a species, and source means for supplying the species to be emitted by the emitter means, the species being contained in an alloy selected from the group consisting of $(Pb_{0.7-1.0} Au_{0.3-0})_{0.7-0.99}$ $(As+Sb)_{0.3-0.01}$ and $Pb_{0.20-0.30} Au_{0.45-0.55} (As+Sb)_{0.20-0.30}$. In particularly preferred embodiments, an arsenic source has a composition of $Au_{0.45} Pb_{0.30} As_{0.25}$ and an antimony source has a composition of $Pb_{0.21} Au_{0.51} Sb_{0.28}$. The emitter means preferably includes a needle substrate having a cusp-type emitter. However, the source alloys may be used in other types of liquid metal ion sources. As used herein, an "alloy" is a composition containing two or more metals or metalloides, and a "species" is one of the constituents thereof. Alloy compositions are indicated by the standard shorthand notation used above, wherein the subscript indicates an atomic fraction.

It will be appreciated that the present invention represents an advance in liquid metal ion sources for high vapor pressure species such as the metalloids arsenic and antimony. The source alloys have low melting points with low vapor pressures of the metalloids, so that the ion sources may be operated for extended periods of time without substantial changes in the composition of the source alloy or the ion beam, and also without substantial damage to the emitter elements. Other features and further advantages of the present invention will become apparent from the following more detailed description, taken in conjunction with the accompanying drawings, which illustrate, by way of example, the principles of the present invention.

DETAILED DESCRIPTION OF THE PREFERRED EMBODIMENT

Figure 1:
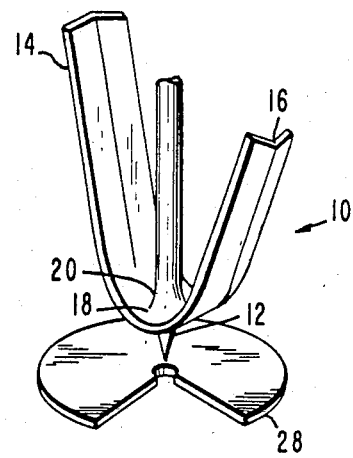
FIG. 1 is a perspective view of a liquid metal ion source.
Figure 2:
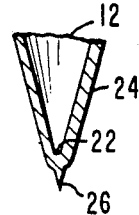
FIG. 2 is an enlarged cross-sectional view of a detail of FIG. 1 taken generally along line 2—2.

The present invention relates to a liquid metal ion source, a preferred embodiment of which is indicated by the numeral 10 in FIG. 1. The ion source 10 includes an evaporation substrate needle 12 having a point whose radius is preferably less than 20 micrometers with an apex half angle less than approximately 49.5°, which extends through a hole (not shown) at the lower end of a generally U-shaped heater element 14. The heater element 14 is in the form of a ribbon having a depressed center to form a channel 16 therein. A reservoir 18 of a liquid ion source metal containing the ions to be emitted is contained within the channel 16 of the heater element 14 at the lowest point of the U-shaped heater element 14, where the needle 12 penetrates through the hole (not shown). An electrical current produced by a voltage $V_H$ is passed through the heater element 14 to melt the ion source metal in the reservoir 18, which then forms a liquid fillet 20 between the needle 12 and the heater element 14. Referring to FIG. 2, the liquid ion source metal from the reservoir 18 flows toward a point 22 of the needle 12, forming a liquid layer 24 along the tip of the needle 12. At the very point 22 of the needle 12, where the liquid layers 24 from the sides of the needle 12 meet, the action of an applied external electrostatic field from an extraction electrode 28 draws the liquid layer 24 downwardly to form a cusp 26 which serves as the emitter point for the ion source 10. That is, the ions emitted by the ion source 10 are preferably emitted only from the cusp 26 so that the ions appear to emanate from a point source of extremely small dimensions. Positively charged metallic ions are drawn from the cusp 26 by the extraction electrode 28 and exit the ion source 10 through a hole in the extraction electrode 28. With this configuration, the current density of emitted ions at the cusp 26 can be very large, typically on the order of $10^6$ amps per square centimeter per steradian. The emitter means described here is presently preferred but the source alloys may be used with emitter means of other types and configurations.

Figure 3:
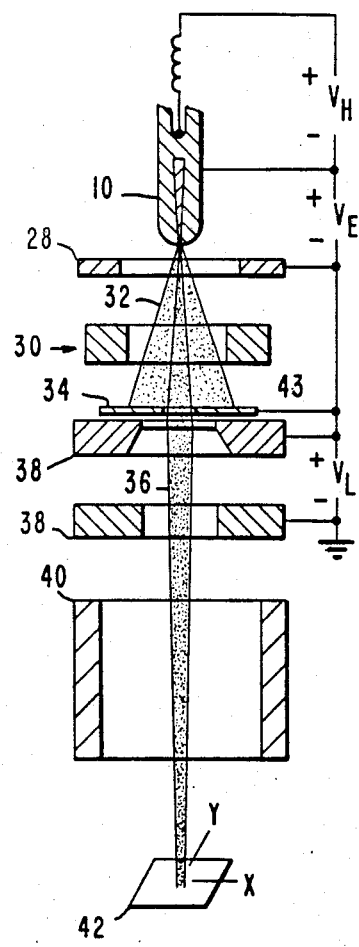
FIG. 3 is a schematic sectional side view of a scanning ion beam system employing a liquid metal ion source.

FIG. 3 illustrates one important application of the use of liquid metal ion sources of the type illustrated in FIGS. 1 and 2. The ion source 10 is mounted in a scanning ion beam system 30. The extraction electrode 28, which is negatively biased with respect to the needle 12 by a voltage $V_E$, draws ions out of the cusp 26, to form an ion beam 32. The cross-sectional shape of the beam of ions 32 is defined by an aperture 34. The transmitted beam 36 emerging from the aperture 34 is passed through accelerating electrodes 38 which increase the energy of the beam 36, as the second accelerating electrode is negatively biased with respect to the first by a voltage $V_L$. The beam 36 then passes through electrostatic deflection electrodes 40, wherein the beam is deflected from side to side to move in a scanning fashion across the surface of a target 42. The transmitted beam 36 can then be used to write various patterns upon the surface of the target 42 in the form of ion implanted zones of controllable shape and type.

Optionally, there is provided an $E \times B$ mass separator 44 to deflect ions of differing masses by differing amounts. The mass separator 44 is preferably positioned between the extraction electrode 28 and the aperture 34, and extraction electrode 28 and the aperture 34, and includes means to produce a magnetic and an electrical field within the mass separator 44. The fields within the mass separator 44 deflect the moving ions by amounts which are related to the mass, velocity, and charge of the ion the beam. By varying the strength of the magnetic and electrical fields and the positioning of the mass separator 44, it is possible to allow only a single desirable species to pass through the aperture 34 to be implanted in the target 42.

The source means containing the species to be evaporated as ions is an alloy selected from the group consisting of $(Pb_{0.7-1.0} Au_{0.3-0})_{0.7-0.99} (As+Sb)_{0.3-0.01}$ and $Pb_{0.20-0.30} Au_{0.45-0.55} (As+Sb)_{0.20-0.30}$. The notation "As+Sb" indicates that this component may consist entirely of arsenic, entirely of antimony, or a combination of the two, within the stated compositional limits. These compositions are selected as containing the desirable species and also as having low melting points whereat the desirable arsenic and antimony species have a low vapor pressure when the alloy is in the liquid state. Consequently, the alloys may be maintained liquid for long periods of time in the liquid metal ion source without a significant change in the alloy's composition due to undesired vaporization of arsenic or antimony. A significant variation from the stated composition results in too high a melting point of the alloy.

Ion source alloys in accordance with the invention may be prepared and supplied to the emission means in any appropriate manner. In one approach, pieces of the constituents are placed into a crucible and melted. The emission means can be loaded by dipping it into the melt. This approach is not preferred, only because some of the alloy may be unused and wasted, and these alloys can be expensive. In a preferred approach, powders of the constituents are pressed together to form an unsintered pellet, and the unsintered pellet is sintered in vacuum at just below the melting point of the alloy so that the pellet holds together. The sintered pellet is then loaded into the emission means, as, for example, by placing the pellet into the reservoir 18 of the ion source.

If an ion source alloy does not naturally wet the emission means such as the needle and reservoir, then the emission means may be treated to enhance the wetting. A technique for enhancing the wetting is described in a copending and commonly assigned U.S. patent application entitled "Process For Enhancing Wetting Of Liquid Metal Alloy Ion Sources", U.S. Ser. No. 673,465. Briefly, and as described therein, wetting of the emission means by the alloys of the present invention may be enhanced by coating the part of the emission means for which enhancement is sought with a gold coating at a temperature much greater than the ion source alloy melting point, before the ion source alloy is loaded into the emission means. Specifically, the emission means can be electroplated with a 0.3 micrometer layer of nickel and then a 0.3 micrometer layer of gold. The plated emission means is heated to 800° C. for one hour in vacuum and cooled. The ion source alloy wets such a coated emission means at source operating temperatures just above the melting points of the alloys, typically about 200° C.–300° C.

The following Examples are presented to illustrate aspects of the invention, and are not to be taken as limiting the scope of the invention in any respect.

EXAMPLE 1

An alloy of composition $Au_{0.45} Pb_{0.30} As_{0.25}$ was prepared by pressing and sintering a pellet from elemental powders. The alloy pellet was placed into the reservoir of the emission means as described in relation to the preferred embodiment. The nickel emission needle had been previously gold coated. The ion source was then operated for 12 hours at a temperature of about 200° C. to about 300° C. There was no indication that any significant amount of arsenic was lost by undesirable vaporization during the period of operation, or of any damage to the evaporation elements by the liquid metal.

EXAMPLE 2

Example 1 was repeated with the same results, except that the ion source alloy was $Pb_{0.21} Au_{0.51} Sb_{0.28}$.

EXAMPLE 3

Example 1 was repeated with the same results, except that the ion source alloy was $Pb_{0.23} Au_{0.50} Sb_{0.28}$.

EXAMPLE 4

Example 1 was repeated with the same results, except that the ion source alloy was $Pb_{0.24} Au_{0.51} Sb_{0.23}$.

EXAMPLE 5

Example 1 was repeated with the sample results, except that the ion source alloy was $Pb_{0.82} Au_{0.15} As_{0.03}$.

As can now be appreciated, the present invention provides a liquid metal ion source for the metalloids arsenic and antimony. The low melting point of the ion source alloy allows the ion source to be operated at from about 200° C. to about 300° C., at which temperature the vapor pressure of the metalloids is sufficiently low that the source may be operated for many hours without significant change in the composition of the ion beam. The low operating temperature also results in essentially no corrosion or damage to the emitting element, even during long runs. Although a few particular embodiments of the present invention have been described in detail for purposes of illustration, various modifications may be made without departing from the true nature and scope of the present invention. Accordingly, the present invention is not to be limited except as by the appended claims.

What is claimed is:
1. A liquid metal ion source, comprising:
   emission means for emitting positively charged ions of a species; and
   source means for supplying the species to be emitted to said emission means, said species being contained in an alloy selected from the group consisting of $(Pb_{0.7-1.0} Au_{0.3-0})_{0.7-0.99} (As+Sb)_{0.3-0.01}$ and $Pb_{0.20-0.30} Au_{0.45-0.55} (As+Sb)_{0.20-0.30}$.
2. This ion source of claim 1, wherein the alloy composition is about $Pb_{0.21} Au_{0.51} Sb_{0.28}$.
3. This ion source of claim 1, wherein the alloy composition is about $Au_{0.45} Pb_{0.30} As_{0.25}$.
4. The ion source of claim 1, wherein said emission means includes a needle and a source metal reservoir.

* * * * *

UNITED STATES PATENT AND TRADEMARK OFFICE
CERTIFICATE OF CORRECTION

PATENT NO. : 4,629,931

DATED : December 16, 1986

INVENTOR(S) : William M. Clark, Jr., et al.

It is certified that error appears in the above-identified patent and that said Letters Patent is hereby corrected as shown below:

Column 1, lines 5-6, after "81-F597-000" delete ", awarded by the Department of the Air Froce".

Signed and Sealed this

Thirteenth Day of October, 1987

Attest:

DONALD J. QUIGG

Attesting Officer

Commissioner of Patents and Trademarks